United States Patent
Ohnuki et al.

(10) Patent No.: US 8,634,166 B2
(45) Date of Patent: Jan. 21, 2014

(54) SUSPENSION SUBSTRATE, SUSPENSION, HEAD SUSPENSION, HARD DISK DRIVE HAVING A CONDUCTIVE CONNECTION SECTION COVERED BY A METALLIC SUPPORT LAYER, METHOD FOR MANUFACTURING SUSPENSION SUBSTRATE AND METHOD FOR TESTING CONTINUITY OF SUSPENSION

(75) Inventors: Masao Ohnuki, Shinjuku-Ku (JP); Yoichi Miura, Shinjuku-Ku (JP)

(73) Assignee: Dai Nippon Printing Co., Ltd., Shinjuku-Ku (JP)

( * ) Notice: Subject to any disclaimer, the term of this patent is extended or adjusted under 35 U.S.C. 154(b) by 69 days.

(21) Appl. No.: 13/179,001

(22) Filed: Jul. 8, 2011

(65) Prior Publication Data

US 2012/0014017 A1    Jan. 19, 2012

(30) Foreign Application Priority Data

Jul. 15, 2010    (JP) ................................. 2010-160933

(51) Int. Cl.
  *G11B 5/55*    (2006.01)
  *H05K 1/09*    (2006.01)
(52) U.S. Cl.
  USPC ..................... 360/245.9; 360/294.4; 174/257
(58) Field of Classification Search
  USPC .................................. 360/245.8, 245.9, 294.4
  See application file for complete search history.

(56) References Cited

U.S. PATENT DOCUMENTS

| | | | |
|---|---|---|---|
| 6,369,987 B1 * | 4/2002 | Khan et al. .................. | 360/245.9 |
| 6,700,748 B1 * | 3/2004 | Cowles et al. ............. | 360/245.9 |
| 6,703,566 B1 * | 3/2004 | Shiraishi et al. ............... | 174/260 |
| 7,167,344 B2 * | 1/2007 | Nakagawa et al. ......... | 360/294.4 |
| 7,440,236 B1 * | 10/2008 | Bennin et al. ............... | 360/294.4 |
| 8,199,442 B2 * | 6/2012 | Okawara et al. ........... | 360/294.4 |
| 8,248,731 B2 * | 8/2012 | Fuchino ..................... | 360/245.8 |
| 8,248,734 B2 * | 8/2012 | Fuchino ..................... | 360/294.4 |
| 2008/0149375 A1 * | 6/2008 | Ishii et al. ..................... | 174/257 |
| 2010/0067151 A1 | 3/2010 | Okawara et al. | |
| 2010/0177445 A1 | 7/2010 | Fuchino | |
| 2010/0246071 A1 | 9/2010 | Nojima et al. | |
| 2011/0157750 A1 * | 6/2011 | Zhu et al. .................... | 360/245.8 |
| 2012/0006586 A1 * | 1/2012 | Ohnuki ......................... | 174/257 |

FOREIGN PATENT DOCUMENTS

| | | |
|---|---|---|
| JP | 2002-208124 A1 | 7/2002 |
| JP | 2010-086649 A1 | 4/2010 |
| JP | 2010-165406 A1 | 7/2010 |
| JP | 2010-238300 A1 | 10/2010 |

OTHER PUBLICATIONS

Japanese Office Action dated Jan. 17, 2012 (with English translation).

* cited by examiner

*Primary Examiner* — Brian Miller
(74) *Attorney, Agent, or Firm* — Burr & Brown, PLLC

(57) ABSTRACT

A suspension substrate according the present invention includes: an insulating layer; a metallic support layer provided on the actuator element's side of the insulating layer. A wiring layer is provided on the other side of the insulating layer. This wiring layer includes a plurality of wirings and a wiring connection section that can be electrically connected with the actuator element via a conductive adhesive. A conductive connection section extending through the insulating layer and configured to connecting the metallic support layer with the wiring connection section of the wiring layer is provided in the connection structure region.

23 Claims, 15 Drawing Sheets

SUSPENSION SUBSTRATE, SUSPENSION, HEAD SUSPENSION, HARD DISK DRIVE HAVING A CONDUCTIVE CONNECTION SECTION COVERED BY A METALLIC SUPPORT LAYER, METHOD FOR MANUFACTURING SUSPENSION SUBSTRATE AND METHOD FOR TESTING CONTINUITY OF SUSPENSION

CROSS REFERENCE TO RELATED APPLICATIONS

This application is based on the prior Japanese Patent Application No. 2010-160933 filed on Jul. 15, 2010, the entire contents of which are incorporated herein by reference.

FIELD OF THE INVENTION

The present invention relates to a suspension substrate, a suspension, a head suspension, a hard disk drive, a method for manufacturing the suspension substrate and a method for testing continuity of the suspension. In particular, this invention relates to the suspension substrate, suspension, head suspension, hard disk drive, method for manufacturing the suspension substrate and method for testing the continuity of the suspension, respectively adapted for enhancing reliability of electrical connection relative to an actuator element used.

BACKGROUND ART

Generally, the hard disk drive (HDD) includes the suspension substrate on which a magnetic head slider mounted. In this case, the magnetic head slider is provided for writing and reading data relative to a disk adapted for storing therein the data. The suspension substrate includes a metallic support layer and a wiring layer having a plurality of wirings layered on the metallic support layer, via an insulating layer. With this configuration, by flowing or sending an electric signal through each wiring, the writing and reading of the data relative to the disk can be performed.

In the hard disk drive of this type, an actuator arm for supporting the magnetic head slider and a VCM actuator (e.g., a voice coil motor) are provided respectively. In this case, in order to move the magnetic head slider to a desired data track on the disk, the actuator arm is pivoted by the VCM actuator, under control of a servo-control system.

In recent years, for an attempt to provide a more high-density disk, the width of each data track has been narrowed. However, in some cases, such an attempt makes it rather difficult to accurately align the magnetic head slider with the desired track, by using the VCM actuator.

To address this problem, the suspension of the so-called dual actuator type has been reported. In this case, the VCM actuator is cooperated with a PZT micro-actuator (or DSA (Dual Stage Actuator)), in order to move the magnetic head slider to the desired track (e.g., see 3P2010-86649A). Specifically, the PZT micro-actuator is composed of a piezoelectric element composed of lead titanate zirconate (PZT) and configured to be expanded and contracted with application of a voltage, thus enabling the magnetic head slider to be finely moved. Namely, in the suspension of the dual actuator type, the VCM actuator serves to roughly control the position of the magnetic head slider, while the PZT micro-actuator serves to finely control the position of the magnetic head slider. In this way, the magnetic head slider can be aligned, rapidly and accurately, with the desired track.

For instance, in the suspension substrate disclosed in the above JP2010-86649A, a through hole for exposing a wiring section is provided in an electric insulating layer, in a terminal portion for supplying electricity to the piezoelectric element, and a ring-like liquid stopper is provided in the piezoelectric element's side of the electric insulating layer. With this configuration, by injecting a liquid conductive adhesive into the liquid stopper, the piezoelectric element can be joined to the terminal portion, as well as the electrode of the piezoelectric element located on the side of the suspension substrate can be electrically connected with the wiring section. Meanwhile, the electrode of the piezoelectric element located on the side opposite to the suspension substrate is electrically connected with a base plate.

SUMMARY OF THE INVENTION

However, in the case of joining the terminal portion of the piezoelectric element to the suspension substrate by using the conductive adhesive, there is a risk that the conductive adhesive injected into the liquid stopper may not adequately reach the wiring section. If the conductive adhesive cannot reach the wiring section, the piezoelectric element cannot be connected with the wiring section.

The present invention was made in view of this inconvenience. Therefore, it is an object of this invention to provide the suspension substrate, suspension, head suspension, hard disk drive, method for manufacturing the suspension substrate and method for testing the continuity of the suspension, respectively capable of enhancing the reliability of electrical connection relative to the actuator element used.

In one aspect for achieving the above object, the present invention provides the suspension substrate including a connection structure region that can be connected with the actuator element via the conductive adhesive, the suspension substrate further including: the insulating layer; the metallic support layer provided on the actuator element's side of the insulating layer; and the wiring layer provided on the other side of the insulating layer, the wiring layer including a plurality of wirings and a wiring connection section capable of being electrically connected with the actuator element via the conductive adhesive, wherein a conductive connection section extending through the insulating layer and configured to connect the metallic support layer with the wiring connection section of the wiring layer is provided in the connection structure region.

In the suspension substrate of this invention, the conductive connection section may be exposed to the exterior on the side opposite to the actuator element.

In the suspension substrate of this invention, a protective layer for covering the wiring layer may be further provided, wherein the conductive connection section is exposed to the exterior from the protective layer.

In the suspension substrate of this invention, the through hole configured to expose the wiring connection section of the wiring layer may be provided in the protective layer, wherein a gold plating is provided to an exposed portion of the wiring connection section in the through hole.

In the suspension substrate of this invention, a metallic-support-layer injection hole extending through the metallic support layer and configured to inject the conductive adhesive may be provided in the connection structure region, wherein an insulating-layer injection hole extending through the insulating layer and configured to expose the wiring connection section is provided in a position corresponding to the metallic-support-layer injection hole, and wherein the gold plating is provided to the exposed portion of the wiring connection section in the insulating-layer injection hole.

In the suspension substrate of this invention, the gold plating may be provided to the metallic support layer in the connection structure region.

In the suspension substrate of this invention, the conductive connection section may be formed of nickel.

In another aspect for achieving the above object, the present invention provides the suspension including: the base plate; the suspension substrate of this invention attached to the base plate via a load beam; and the actuator element joined to at least one of the base plate and load beam, the actuator element being connected with the connection structure region of the suspension substrate via the conductive adhesive.

In still another aspect, the present invention provides the head suspension including: the suspension of this invention; and the slider mounted on the suspension.

In still another aspect, the present invention provides the hard disk drive including the head suspension of this invention.

In still another aspect for achieving the above object, the present invention provides the method for manufacturing the suspension substrate including the connection structure region that can be connected with the actuator element via the conductive adhesive, the method including: preparing a layered material including the insulating layer, the metallic support layer provided on the actuator element's side of the insulating layer and having electrical conductivity, and the wiring layer provided on the other side of the insulating layer; forming the plurality of wirings and the wiring connection section that can be electrically connected with the actuator element via the conductive adhesive, in the wiring layer; forming an insulating-layer conductive connection hole extending through the insulating layer in the connection structure region, in the insulating layer; and forming the conductive connection section for connecting the metallic support layer with the wiring connection section of the wiring layer, in the insulating-layer conductive connection hole.

In the method for manufacturing the suspension substrate of this invention, a wiring-layer conductive connection hole extending through the wiring connection section may be formed in a position corresponding to the insulating-layer conductive connection hole, when the plurality of wirings and wiring connection section are formed in the wiring layer, wherein the conductive connection section is formed in the insulating-layer conductive connection hole and wiring-layer conductive connection hole, and is exposed to the exterior on the side opposite to the actuator element.

In the method for manufacturing the suspension substrate of this invention, forming the protective layer for covering the wiring layer may be further provided, wherein when the protective layer is formed, a protective-layer conductive connection hole extending through the protective layer is formed in a position corresponding to the wiring-layer conductive connection hole, and wherein the conductive connection section is formed in the insulating-layer conductive connection hole, wiring-layer conductive connection hole and protective-layer conductive connection hole, and is exposed to the exterior from the protective layer.

In the method for manufacturing the suspension substrate of this invention, when the protective layer is formed, a through hole configured to expose the wiring connection section of the wiring layer may be formed in the protective layer, and the gold plating is provided to the exposed portion of the wiring connection section, in the through hole.

In the method for manufacturing the suspension substrate of this invention, forming the metallic-support-layer injection hole extending through the metallic support layer and configured to inject the conductive adhesive may be further provided, wherein when the insulating-layer conductive connection hole is formed in the insulating layer, the insulating-layer injection hole extending through the insulating layer and configured to expose the wiring connection section is formed in the position corresponding to the metallic-support-layer injection hole, and wherein the gold plating is provided to the exposed portion of the wiring connection section of the wiring layer, in the metallic-support-layer injection hole and insulating-layer injection hole.

In the method for manufacturing the suspension substrate of this invention, the gold plating may be provided to the metallic support layer in the connection structure region.

In the method for manufacturing the suspension substrate of this invention, the conductive connection section may be formed by nickel plating.

In still another aspect for achieving the above object, the present invention provides the method for testing the continuity of the suspension, the suspension including the actuator element and the suspension substrate including the connection structure region that can be connected with the actuator element via the conductive adhesive, and the method being capable of testing the continuity between the actuator element and the connection structure region and including: preparing the suspension substrate including the insulating layer, the metallic support layer provided on the actuator element's side of the insulating layer, and the wiring layer provided on the other side of the insulating layer, the wiring layer having the plurality of wirings and wiring connection section capable of being electrically connected with the actuator element via the conductive adhesive, wherein the conductive connection section, which extends through the insulating layer, connects the metallic support layer with the wiring connection section of the wiring layer, and is exposed to the exterior on the side opposite to the actuator element, is provided in the connection structure region; obtaining the suspension by connecting the actuator element with the wiring connection section of the wiring layer of the suspension substrate via the conductive adhesive; and testing the continuity between the conductive connection section and the actuator element, by bringing continuity inspection equipment into contact with the exposed conductive connection section.

According to the present invention, the wiring connection section of the wiring layer can be electrically connected with the metallic support layer via the conductive connection section. Further, the metallic support layer can be electrically connected with the actuator element via the conductive adhesive. Therefore, the actuator element can be electrically connected with the wiring connection section, via the conductive connection section and metallic support layer. Thus, the reliability of electrical connection between the suspension substrate and the actuator element can be securely enhanced.

DETAILED DESCRIPTION OF THE INVENTION

First Embodiment

Now, referring to FIGS. 1 through 9, the suspension substrate, suspension, head suspension and hard disk drive, respectively related to the first embodiment of the present invention, will be described.

Figure 1:
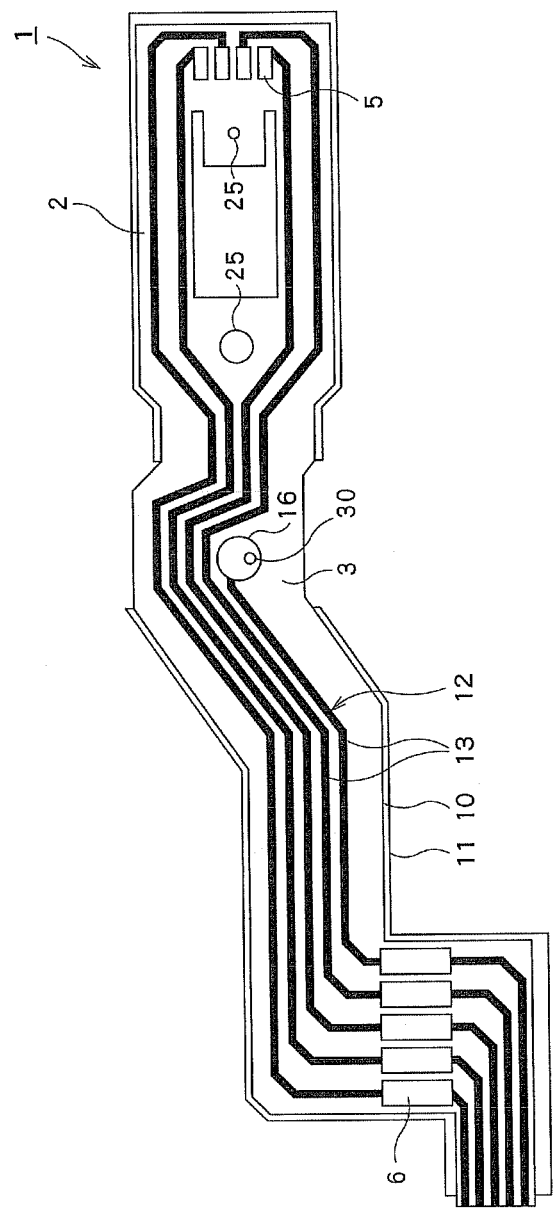
FIG. 1 is a plan view showing one example of the suspension substrate related to a first embodiment of the present invention.
Figure 2:
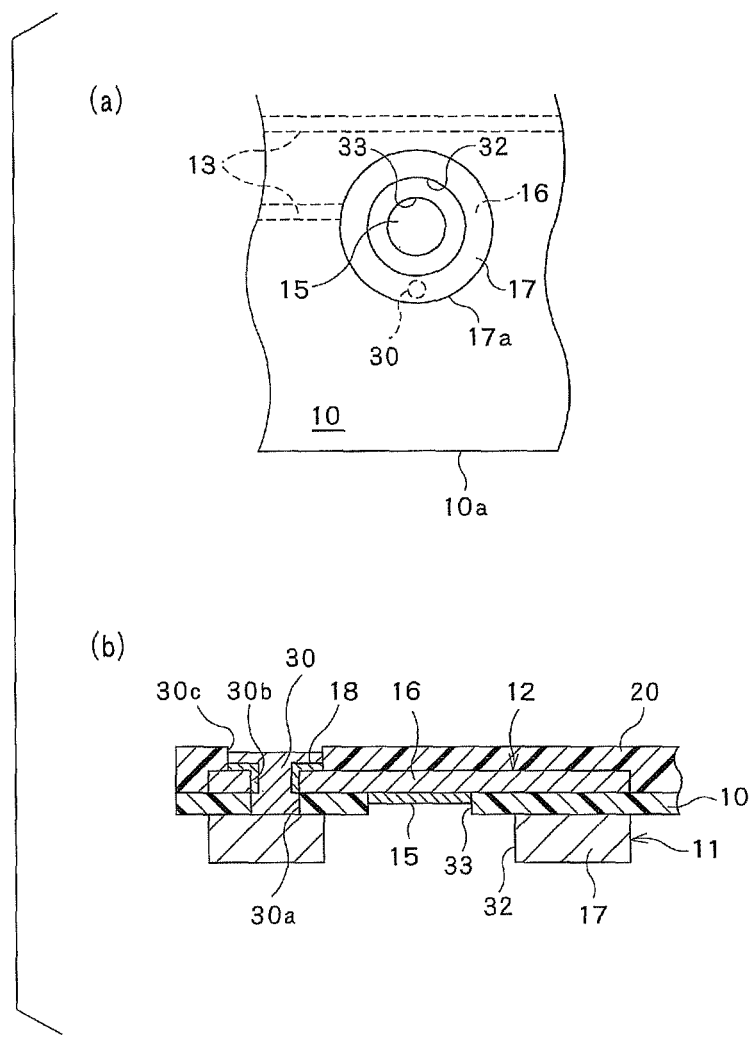
FIG. 2(a) is a back view showing one connection structure region in the suspension substrate related to the first embodiment of the present invention.
FIG. 2(b) is a cross section for illustrating this connection structure region.

As shown in FIG. 1, the suspension substrate 1 includes a substrate main body region 2 having the wirings 13 that respectively extend along this substrate main body region 2 and will be described later, and the connection structure region 3 that can be connected with the piezoelectric element (or actuator element (see FIG. 3)) 44 that will be described later. The substrate main body region 2 includes a head terminal 5 provided to be connected with the slider 52 (see FIG. 7) that will be described later, and an external equipment connection terminal 6 provided to be connected with external equipment (not shown). In this case, the wirings 13 are respectively provided to extend between the head terminal 5 and the external equipment connection terminal 6, in order to connect the two terminals 5, 6.

As shown in FIG. 1 and FIGS. 2(a), 2(b), the suspension substrate 1 further includes the insulating layer 10, the metallic support layer 11 provided on the piezoelectric element's side of the insulating layer 10, and the wiring layer 12 provided on the other side of the insulating layer 10. The wiring layer 12 includes the plurality of wirings 13. The wiring layer 12 further includes the wiring connection section 16 located in the connection structure region 3 and capable of being electrically connected with the piezoelectric element 44 via a proper conductive adhesive (e.g., silver paste). The wiring connection section 16 is formed of the same material as the material used for forming each wiring 13. In this case, one wiring 13 of the plurality of wirings 13 extends from the external equipment connection terminal 6 up to the connection structure region 3, in order to be electrically connected with the piezoelectric element 44 via the wiring connection section 16.

Although not shown, a seed layer formed of nickel (Ni), chromium (Cr) and copper (Cu) and having an approximately 300 μm thickness is provided between the insulating layer 10 and the wiring layer 12. With the provision of this seed layer, the adhesion between the insulating layer 10 and the wiring layer 12 can be enhanced.

As shown in FIG. 2(b), in the connection structure region 3, the metallic-support-layer injection hole 32 for allowing the conductive adhesive to be injected is provided to extend through the metallic support layer 11. More specifically, as shown in FIG. 2(a), the metallic support layer 11 has a frame portion 17 including the metallic-support-layer injection hole 32 provided for allowing the conductive adhesive to be injected. This frame portion 17 is formed into a ring-like shape, and has an outer periphery 17a positioned inside relative to the outer periphery 10a of the insulating layer 10. It is noted that the frame portion 17 is separated from the other portion of the metallic support layer 11 located in the substrate main body region 2.

As shown in FIG. 2(b), the insulating-layer injection hole 33 is provided to extend through the insulating layer 10, in a position corresponding to the metallic-support-layer injection hole 32, in the insulating layer 10. Thus, the wiring connection section 16 of the wiring layer 12 is exposed to the side of the metallic support layer 11.

Further, in the insulating-layer through hole 33, the nickel (Ni) plating and gold (Au) plating are provided, successively, to the exposed portion of the wiring connection section 16 of the wiring layer 12, in order to form an injection hole plated layer 15. This injection hole plated layer 15 can serve to positively prevent corrosion in the exposed portion of the wiring connection section 16 of the wiring layer 12. Preferably, the thickness of the injection hole plated layer 15 is within a range of from 0.1 to 4.0 μm.

As shown in FIG. 2(b), a protective layer 20 for covering the wiring layer 12 is provided on the insulating layer 10. For clarity, this protective layer 12 is not shown in FIG. 1.

In the connection structure region 3, the conductive connection section (via) 30 is provided to extend through the insulating layer 10, in order to connect the frame portion 17 of the metallic support layer 11 with the wiring connection section 16 of the wiring layer 12. More specifically, the insulating-layer conductive connection hole 30a is formed to extend through the insulating layer 10, and the wiring-layer conductive connection hole 30b is formed to extend the wiring connection section 16, and the protective-layer conductive connection hole 30c is formed to extend through the protective layer 20. Further, the conductive connection section 30 formed of nickel is provided in the insulating-layer conductive connection hole 30a, wiring-layer conductive connection hole 30b and protective-layer conductive connection hole 30c. This conductive connection section 30 is exposed to the exterior on the side opposite to the piezoelectric element 44, i.e., exposed to the exterior from the protective layer 20. In addition, a via plating layer 18 is provided between the conductive connection section 30 and the wiring connection section 16. This via plating layer 18 can be formed in the same manner as in the case of forming the injection hole plated layer 15 provided to the exposed portion of the wiring connection section 16 in the insulating-layer injection hole 33.

Further, as shown in FIG. 1, two jig holes 25 are provided in the substrate main body region 2. Each jig hole 25 extends through the metallic support layer 11 and insulating layer 10, and is used for alignment for the load beam 43 that will be described later.

Now, each component will be described in more detail.

As the material used for forming the insulating layer 10, any suitable material can be used, without limitation, provided that this material can exhibit desired insulating properties. Preferably, a polyimide (PI) material is used. It is noted that the material for the insulating layer 10 may be a photosensitive material or otherwise may be a non-photosensitive material.

Preferably, the thickness of the insulating layer 10 is within a range of from 5 μm to 30 μm, more preferably 8 μm to 10 μm. With this thickness of the insulating layer 10, desired insulating ability between the metallic support layer 11 and each wiring 13 can be ensured. Further, this thickness of the insulating layer 10 can effectively prevent the rigidity of the entire suspension substrate 1 from being lowered.

Each wiring 13 is provided as a conductive body or element adapted for transmitting the electric signal. As the material used for forming each wiring 13, any suitable material can be used, without limitation, provided that this material can exhibit desired conductivity. For instance, a copper (Cu) material is suitable. However, any other material than the copper material can be used, provided that this material can exhibit the electric properties equivalent to those of pure copper. Preferably, the thickness of each wiring 13 is within a range of from 1 μm to 18 μm, more preferably 9 μm to 12 μm. This thickness can ensure adequate transmission characteristics of each wiring 13, as well as can prevent the flexibility of the entire suspension substrate 1 from being lowered. It is noted that the wiring connection section 16 is formed of the same material as the material of each wiring 13, and has the same thickness as the thickness of each wiring 13.

As the material used for forming the metallic support layer 11, any suitable material can be used, without limitation, provided that this material can exhibit adequate conductivity, elasticity and strength. For instance, stainless steel, aluminum, beryllium copper and other suitable copper alloys can be used. Preferably, stainless steel is used. Preferably, the thickness of the metallic support layer 11 is within a range of from 10 μm to 30 μm, more preferably 15 μm to 20 μm. With this configuration, the conductivity, rigidity and elasticity of the metallic support layer 11 can be well ensured.

As the material used for the protective layer 20, a proper resin material, e.g., polyimide, can be used. It is noted that the material of this protective layer 20 may be either of the photosensitive material or non-photosensitive material.

Now, referring to FIGS. 3 through 6, the suspension 41 related to this embodiment will be described. The suspension 41 shown in FIG. 3 includes the aforementioned suspension substrate 1, base plate 42, load beam 43 attached onto the base plate 42 and adapted for holding the metallic support layer 11 of the suspension substrate 1, and the piezoelectric elements 44 joined to at least one of the base plate 42 and load beam 43 and connected with the connection structure regions 3 of the suspension substrate 1. In this embodiment, the piezoelectric element 44 is joined to the base plate 42. The base plate 42 and load beam 43 are respectively formed of stainless steel. In this case, the base plate 42 includes an opening 42a provided for housing therein the piezoelectric element 44, and a pair of flexible portions 42b.

Figure 4:
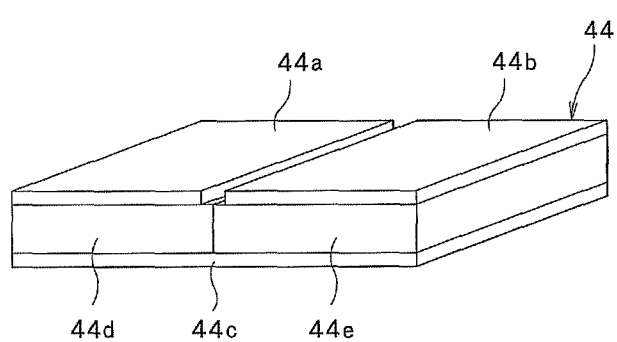
FIG. 4 is a perspective view of one piezoelectric element in the suspension related to the first embodiment of the present invention.

The piezoelectric element 44 is configured to be expanded and contracted when a proper voltage is applied thereto. More specifically, as shown in FIG. 4, the piezoelectric element 44 includes a first electrode 44a and a second electrode 44b, respectively isolated from each other, one common electrode 44c located to be opposed to the first and second electrodes 44a, 44b, a first piezoelectric material part 44d located between the first electrode 44a and the common electrode 44c, and a second piezoelectric material part 44e located between the second electrode 44b and the common electrode 44c. The first piezoelectric material part 44d is transformed, depending on the voltage applied between the first electrode 44a and the common electrode 44c, while the second piezoelectric material part 44e is transformed, depending on the voltage applied between the second electrode 44b and the common electrode 44c. The first and second piezoelectric material parts 44d, 44e are respectively composed of, for example, suitable piezoelectric ceramics, such as the PZT (lead titanate zirconate) or the like, and arranged to be respectively polarized, in different directions, by 180°, relative to each other. In this case, either one of the first and second electrodes 44a, 44b or common electrode 44c is earthed. Therefore, when a predetermined voltage is applied to the other of the first and second electrodes 44a, 44b or common electrode 44c, one of such first and second piezoelectric material parts 44d, 44e will be contracted, while the other piezoelectric material part 44d or 44e will be expanded. As a result, the entire body of the piezoelectric element 44 will be transformed into a substantially trapezoidal shape, thereby effectively moving the slider 52 via the load beam 43.

Figure 3:
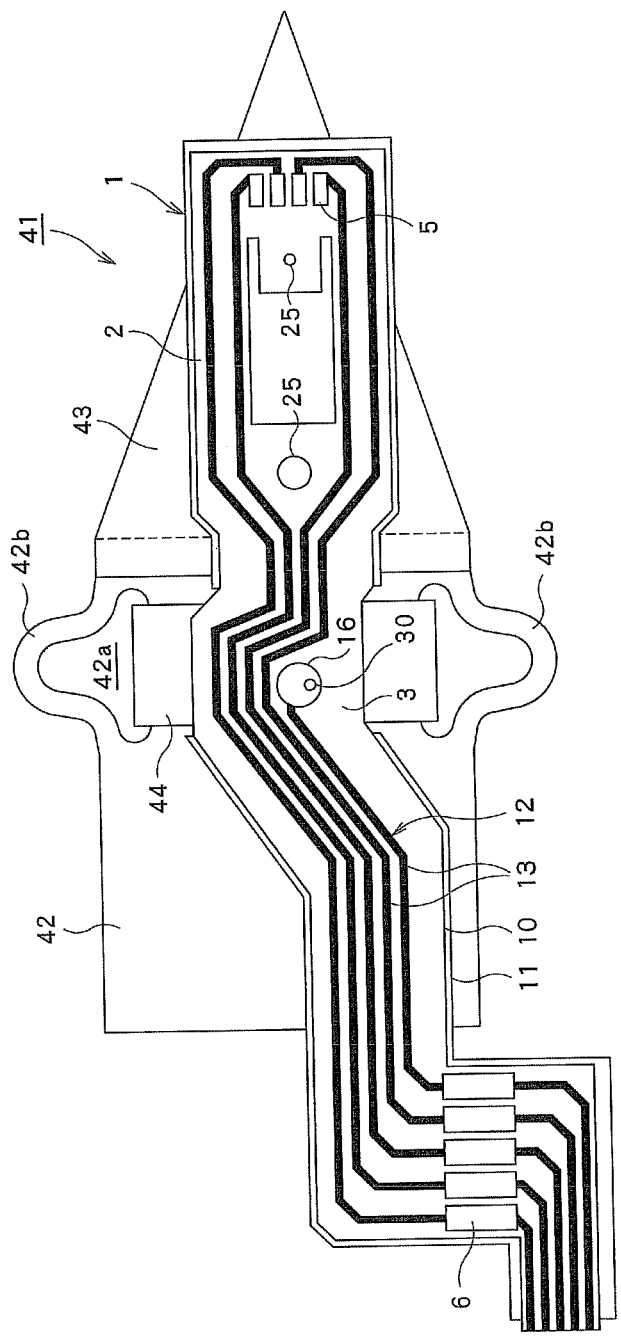
FIG. 3 is a plan view showing one example of the suspension related to the first embodiment of the present invention.
Figure 5:
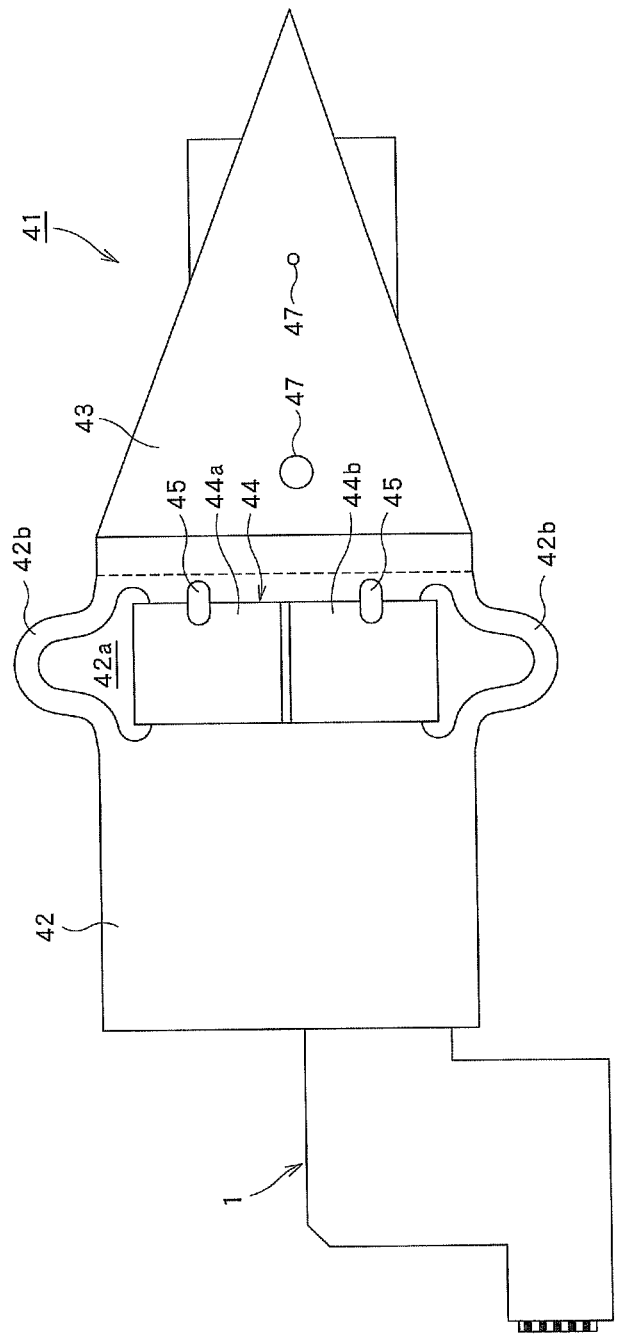
FIG. 5 is a back view showing one example of the suspension related to the first embodiment of the present invention.

Such a piezoelectric element 44 is housed in the opening 42a of the base plate 42, as shown in FIGS. 3 and 5, and is joined to the base plate 42 via a non-conductive adhesive.

More specifically, as shown in FIG. 5, one electrode (or electrode located on the opposite side relative to the suspension substrate 1), i.e., the first and second electrodes 44a, 44b, of the piezoelectric element 44 is electrically connected with the base plate 42, via a first conductive adhesion section 45 formed of the conductive adhesive.

Figure 6:
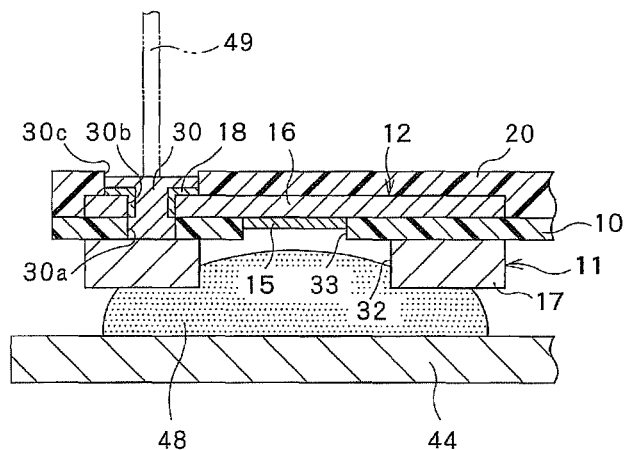
FIG. 6 is a cross section illustrating the connection structure region in the suspension related to the first embodiment of the present invention.

Meanwhile, the other electrode (or electrode located on the side of the suspension substrate 1), i.e., the common electrode 44c, of the piezoelectric element 44 is joined and electrically connected to the connection structure region 3, via the conductive adhesive. Namely, as shown in FIG. 6, a second conductive adhesion section 48 formed of the conductive adhesive is provided in both of the insulating-layer injection hole 33 and metallic-support-layer injection hole 32 in the connection structure region 3. In this case, the piezoelectric element 44 is joined to the connection structure region 3 via the second conductive adhesion section 48, with the common electrode 44c of this piezoelectric element 44 being electrically connected with the wiring connection section 16 of the wiring layer 12, via the second conductive adhesion section 48. Further, the second conductive adhesion section 48 is also provided in a small gap provided to extend between the frame portion 17 of the metallic support layer 11 and the piezoelectric element 44. While one example, in which the conductive adhesive does not reach the wiring connection section 16, is shown in FIG. 6, this wiring connection section 16 can be connected with the piezoelectric element 44, via the conductive connection section 30, frame portion 17 and second conductive adhesion section 48.

Further, beam jig holes 47 are provided in the load beam 43, respectively corresponding to the jig holes 25 of the suspension substrate 1. Such beam jig holes 47 can be respectively used for aligning the suspension substrate 1 and load beam 43, when the load beam 43 is mounted on the metallic support layer 11 of the substrate main body region 2 of the suspension substrate 1.

Figure 7:
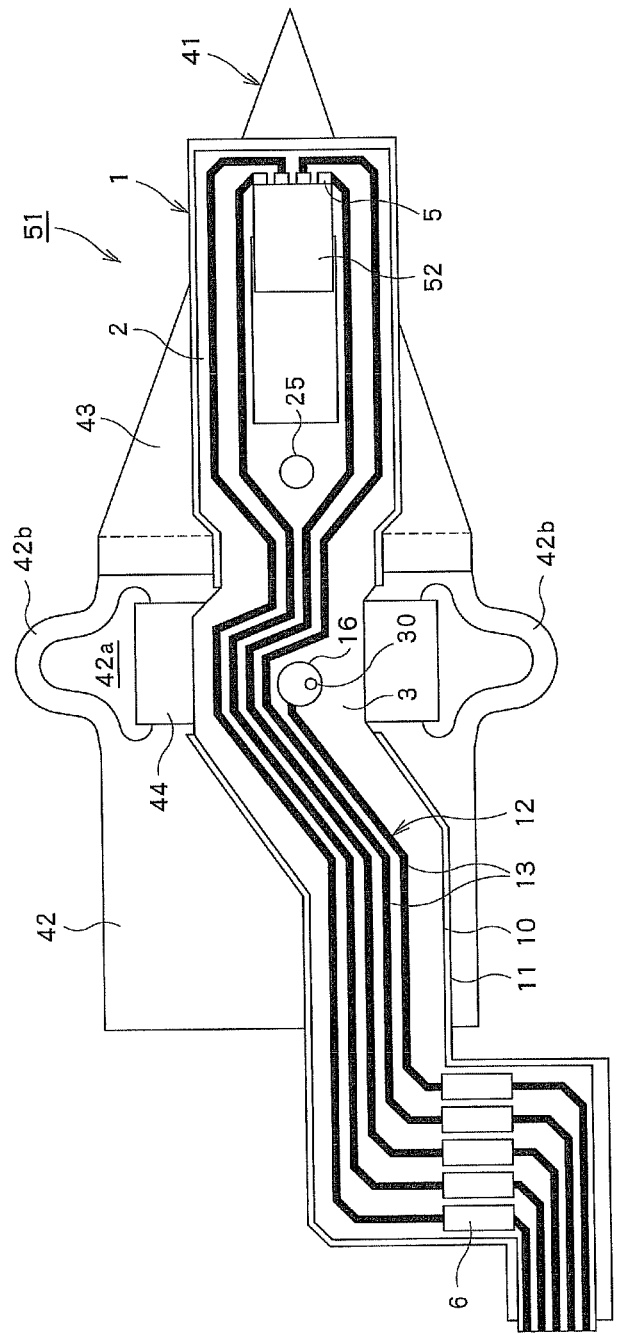
FIG. 7 is a plan view showing one example of the head suspension related to the first embodiment of the present invention.

Now, referring to FIG. 7, the head suspension 51 related to this embodiment will be described. As shown in FIG. 7, the head suspension 51 includes the aforementioned suspension 41 and slider 52 connected with the head terminal 5 of the suspension substrate 1.

Figure 8:
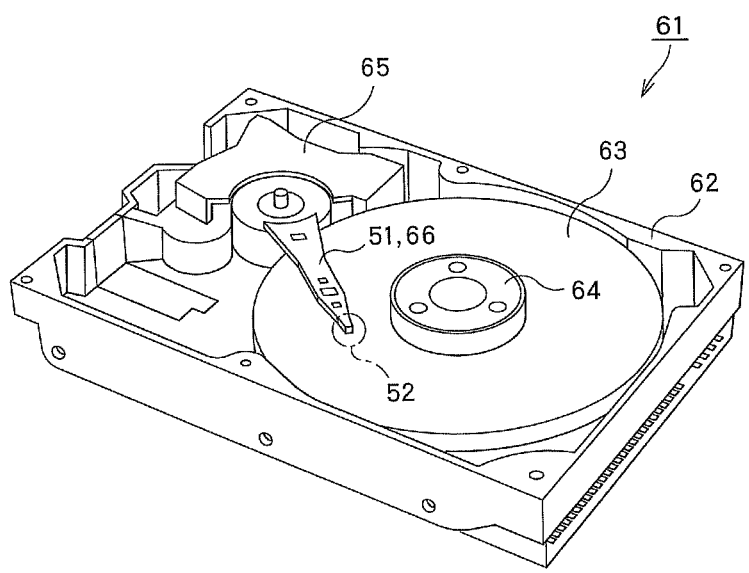
FIG. 8 is a perspective view showing one example of the hard disk drive related to the first embodiment of the present invention.
Figure 9:
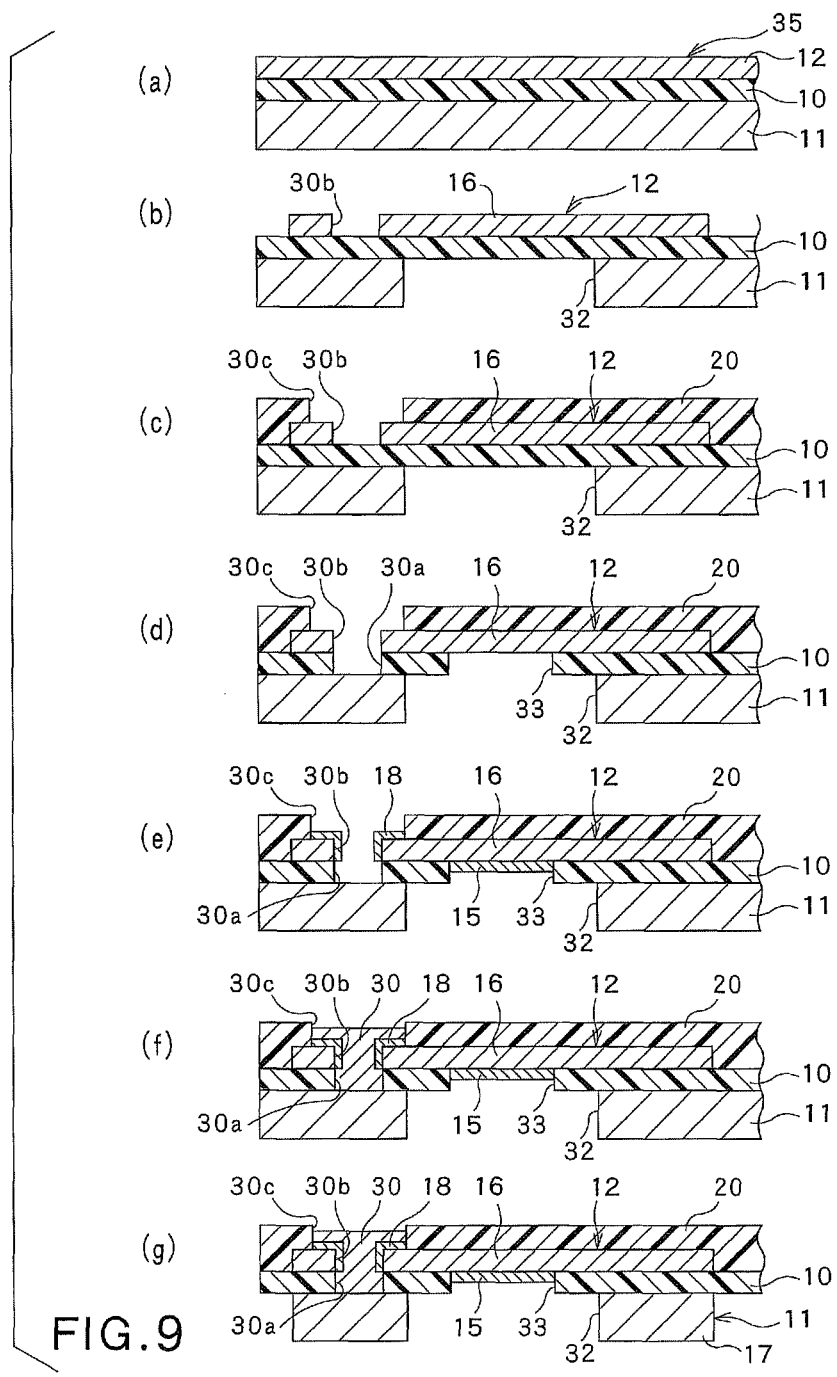
FIGS. 9(a) through 9(g) are respectively provided for illustrating one method for manufacturing the suspension substrate related to the first embodiment of the present invention.

Next, referring to FIG. 8, the hard disk drive 61 related to this embodiment will be described. As shown in FIG. 8, the hard disk drive 61 includes a case 62, the disk 63 rotatably attached to the case 62 and adapted for storing therein the data, a spindle motor 64 adapted for rotating the disk 63, and the head suspension 51 including the slider 52 adapted for writing and reading the data relative to the disk 63. In this case, the head suspension 51 is provided to be moved near the disk 63, while keeping a desired flying height relative to the disk 63. Specifically, the head suspension 51 is movably attached to the case 62, such that the voice coil motor 65 attached to the case 62 can move the slider 52 of the head suspension 51 along the disk 63. Further, in this case, the head suspension 51 is attached to the voice coil motor 65, via an arm 66.

Next, one exemplary method for manufacturing the suspension substrate 1 related to the embodiment, will be discussed. In this case, one subtractive method for manufacturing the suspension substrate 1 (especially, the connection structure region 3) will be described, by way of example.

First of all, a layered body or material 35, including the insulating layer 10, the metallic support layer 11 provided on one face of the insulating layer 10, and the wiring layer 12 provided on the other face of the insulating layer 10, is prepared (see FIG. 9(a)).

In this case, the metallic layer 11 is first prepared, and then the insulating layer 10 is formed on the metallic layer 11 by a coating method using non-photosensitive polyimide. Subsequently, nickel, chromium and copper are coated, by spattering, successively, on the insulating layer 10, in order to form the seed layer (not shown) thereon. Thereafter, by using the so-formed seed layer as an electrically conductive medium, the wiring layer 12 is formed by copper plating. In this way, the layered body 35 including the insulating layer 10, metallic support layer 11 and wiring layer 12 can be obtained.

Then, the plurality of wirings 13, wiring connection section 16 and wiring-layer conductive connection hole 30b are respectively formed in the wiring layer 12, and the metallic-support-layer injection hole 32 is formed in the metallic support layer 11 (see FIG. 9(b)). In this case, a pattern-like resist (not shown) is first formed on the top face of the wiring layer 12 as well as on the bottom face of the metallic support layer 11, by a photo-fabrication method using a dry film. More specifically, the pattern-like resist is formed, such that the plurality of wirings 13, wiring connection section 16 and wiring-layer conductive connection hole 30b can be respectively formed in the wiring layer 12, as well as the metallic-support-layer injection hole 32 can be formed in the metallic support layer 11. Subsequently, each part exposed from the resist formed on both of the wiring layer 12 and metallic support layer 11 is etched. As the method for etching the wiring layer 12 and metallic support layer 11, any suitable method can be employed, without limitation. Preferably, a wet etching method is used. In particular, it is preferred to properly select an etching liquid, depending on the kind of the material used for forming the metallic support layer 11. For instance, in the case of etching the metallic support layer 11 formed of stainless steel, an iron-chloride-based etching liquid, such as an aqueous ferric chloride solution or the like, can be used. After this etching process is ended, the resist is removed.

Thereafter, on the insulating layer 10, the protective layer 20 for covering each wiring 13 and wiring connection section 16 of the wiring layer 12 is provided. Then, the protective-layer conductive connection hole 30c is formed in the protective layer 20 (see FIG. 9(c)). In this case, the non-photosensitive polyimide is first coated on the insulating layer 10, by using a die coater. Subsequently, the protective layer 20 is formed by drying up the coated non-photosensitive polyimide. Then, on the so-formed protective layer 20, another pattern-like resist (not shown) is formed, such that the protective-layer conductive connection hole 30c can be formed. Subsequently, the resultant protective layer 20 is developed and etched, and then the so-etched protective layer 20 is cured or hardened, thereby obtaining the protective layer 20 having a desired shape. Once this process is ended, the resist is removed.

Thereafter, the insulating-layer conductive connection hole 30a and insulating-layer injection hole 33 are respectively formed to extend through the insulating layer 10, and the outer shape of this insulating layer 10 is processed into a desired shape (see FIG. 9(d)). In this case, a still another pattern-like resist is first formed on the insulating layer 10, and then each part of the insulating layer 10 exposed from the resist is etched, thereby forming the insulating-layer conductive connection hole 30a and insulating-layer injection hole 33 in the insulating layer 10 as well as processing the outer shape of the insulating layer 10. As the method for etching the insulating layer 10, any suitable method can be employed, without limitation. Preferably, the wet etching method is used. In particular, it is preferred to properly select the etching liquid, depending on the kind of the material used for forming the insulating layer 10. For instance, in the case of etching the insulating layer 10 formed of a polyimide resin, an alkaline etching liquid, such as an organic alkaline etching liquid or the like, can be used. After this etching process is ended, the resist is removed.

Thereafter, the gold plating is provided to one portion of the wiring connection section 16 of the wiring layer 12 exposed in the insulating-layer injection hole 33 as well as to another portion of the wiring connection section 16 exposed in the wiring-layer conductive connection hole 30b (see FIG. 9(e)). More specifically, each exposed portion of the wiring connection section 16 is first washed with an acid, and then the nickel plating and gold plating are provided successively to this portion, by an electrolytic plating method. Thus, the injection hole plated layer 15 and via plating layer 18, respectively having the thickness of 0.1 μm to 4.0 μm, can be provided. In this case, the head terminal 5 that will be connected with the slider 52 and the external-equipment connection terminal 6 are also plated in the same manner. As the plating method used in this case, a jig plating method may be employed, in place of the electrolytic plating method. Further, the sort of the metal plating used in this case is not limited to the nickel plating and gold plating. For instance, silver (Ag) plating and/or copper (Cu) plating may be employed.

After the injection hole plated layer 15 and via plating layer 18 are respectively formed, the conductive connection section 30 is formed in the insulating-layer conductive connection hole 30a, wiring-layer conductive connection hole 30b and protective-layer conductive connection hole 30c (see FIG. 9(f)). In this case, a proper pattern-like resist (not shown) is first formed on the protective layer 20, by using the dry film, such that the respective conductive connection holes 30a, 30b, 30c can be exposed. Subsequently, the nickel plating is provided to the respective conductive connection holes 30a, 30b, 30c, by the electrolytic plating method. As a plating bath (or liquid) for this plating process, a standard nickel sulfamate plating bath is used in an electrolytic immersion plating (0.2 A, 14 minutes). In this way, the conductive connection section 30 formed of nickel can be provided in the respective conductive connection holes 30a, 30b, 30c. Thereafter, the resist is removed.

Then, the frame portion 17 is formed in the metallic support layer 11, and the outer shape of this metallic support layer 11 is processed into the desired shape (see FIG. 9(g)). In this case, another suitable pattern-like resist is formed on the bottom face of the metallic support layer 11, by using the dry film. Namely, in this case, the pattern-like resist is formed on the metallic support layer 11, such that the frame portion 17 can be provided to this layer 11. Then, each part of the metallic support layer 11 exposed from the resist is etched with the iron-chloride-based etching liquid, in order to form the frame portion 17 and process the outer shape of the metallic support layer 11. Due to this etching process, the frame portion 17 is separated from the other part of the metallic support layer 11 in the substrate main body region 2. Thereafter, the resist is removed.

In this way, the suspension substrate 1 can be obtained.

Now, one method for manufacturing the suspension related to this embodiment will be described.

First of all, the base plate 42 and load beam 43 are respectively prepared, and the suspension substrate 1 is also prepared, in such a manner as described above.

Thereafter, as shown in FIG. 3, the suspension substrate 1 is attached, by welding, to the base plate 42, via the load beam 43. In this case, the load beam 43 is first fixed in position, by welding, to the base plate 42, and then the suspension substrate 1 is aligned with the load beam 43, by utilizing the jig holes 25 respectively provided in the suspension substrate 1 and the beam jig holes 47 respectively provided in the load beam 43. Thereafter, the suspension substrate 1 is joined and fixed, by welding, to the load beam 43.

Then, the piezoelectric element 44 is aligned and housed in the opening 42a of the base plate 42, and then joined to the base plate 42 by using a proper adhesive, as well as connected with the connection structure region 3 of the suspension substrate 1, by using another proper adhesive. More specifically, the piezoelectric element 44 is joined to the base plate 42 by using the non-conductive adhesive, while the first electrode 44a and second electrode 44b of this piezoelectric element 44 are electrically connected with the base plate 42 via the first conductive connection section 45 formed of the conductive adhesive.

Further, the common electrode 44c of the piezoelectric element 44 is joined and electrically connected relative to the connection structure region 3 of the suspension substrate 1, by using the conductive adhesive. In this case, the conductive adhesive is injected into the insulating-layer injection hole 33 and metallic-support-layer injection hole 32, via the gap provided between the frame portion 17 of the metallic support layer 11 and the common electrode 44c of the piezoelectric element 44, thereby forming the second conductive adhesion section 48. In this way, the piezoelectric element 44 can be joined to the connection structure region 3 of the suspension substrate 1, as well as the common electrode 44c of this piezoelectric element 44 can be electrically connected with the wiring connection section 16 of the wiring layer 12. In this process, the gap provided between the metallic support layer 11 and the piezoelectric element 44 is also filled with the conductive adhesive (see FIG. 6).

In this way, the suspension 41 including the piezoelectric element 44 connected with the connection structure regions 3 of the suspension substrate 1, can be obtained.

Next, one method for testing the continuity of the suspension 41 (more specifically, the method for testing the electrical continuity between the conductive connection section 30 and the piezoelectric element 44) will be described. In this case, in order to test the electrical continuity between the conductive connection section 30 and the piezoelectric element 44, a distal end of an inspection equipment 49, such as a probe or the like (see FIG. 6), is contacted and pressed against the conductive connection section 30 exposed in the suspension substrate 1 of the suspension 41 obtained as described above. Thus, the electrical continuity between the conductive connection section 30 and the piezoelectric element 44 can be readily inspected. As such, the reliability of electrical connection between the suspension substrate 1 and the piezoelectric element 44 can be enhanced.

Further, the head suspension 51 as shown in FIG. 7 can be obtained by connecting the slider 52 with the head terminal 5 of the suspension 41. Furthermore, the hard disk drive 61 as shown in FIG. 8 can be obtained by attaching the head suspension 51 to the case 62 of the hard disk drive 61.

Upon the writing and reading operation for the data performed in the hard disk drive 61 shown in FIG. 8, the slider 52 of the head suspension 51 is moved along the disk 63 by the voice coil motor 65, with the desired flying height being kept between the slider 52 and the disk 63 rotated by the spindle motor 64. With this operation, the data is transferred between the slider 52 and the disk 63. Namely, during this operation, the electric signal is transmitted through each wiring 13 extending between the head terminal 5 of the suspension substrate 1 and the external equipment connection terminal 6.

Upon moving the slider 52, the voice coil motor 65 serves to roughly control the position of the slider 52, and each piezoelectric element 44 serves to finely control the position of the slider 52. Namely, when the predetermined voltage is applied to the common electrode 44c of the piezoelectric element 44 located on the side of the connection structure region 3 of the suspension substrate 1, one piezoelectric material part of the piezoelectric element 44 will be contracted in the axial direction of the load beam 43, while the other piezoelectric material part will be expanded in the same direction. In this case, each flexible portion 42b of the base plate 42 is elastically transformed, as such the slider 52 located on the distal end side of the load beam 43 can be moved in a sway direction (or pivot direction). In this way, the slider 52 can be aligned, rapidly and accurately, with a desired track of the disk 63.

As stated above, according to this embodiment, the wiring connection section 16 of the wiring layer 12 is electrically connected with the frame portion 17 of the metallic support layer 11, via the conductive connection section 30. Further, the frame portion 17 is electrically connected with the piezoelectric element 44 via the second conductive connection section 48. Thus, the piezoelectric element 44 can be electrically connected with the wiring connection section 16, via the conductive connection section 30 and frame portion 17. In particular, as shown in FIG. 6, even in the case in which the conductive adhesive injected in the metallic-support-layer injection hole 32 and insulating-layer injection hole 33 does not reach the wiring connection section 16, since the metallic support layer 11 is electrically connected with the piezoelectric element 44 via the second conductive connection section 48, the piezoelectric element 44 can be electrically connected, securely, with the wiring connection section 16. As such, the reliability of electrical connection between the suspension substrate 1 and the piezoelectric element 44 can be enhanced.

Further, according to the present invention, since the conductive connection section 30 is exposed to the exterior from the protective layer 20, the continuity test between the piezoelectric element 44 and the conductive connection section 30 can be performed, from the top face of the conductive connection section 30, by using the continuity inspection equipment 49, such as the probe or the like. Thus, the reliability of electrical connection between the suspension substrate 1 and the piezoelectric element 44 can be ensured. Additionally, in this case, since the conductive connection section 30 is formed by the nickel plating, deformation of the top face of the conductive connection section 30 can be prevented, even in the case in which the distal end of the continuity inspection equipment 49 is pressed against the top face of the conductive connection section 30.

Figure 10:
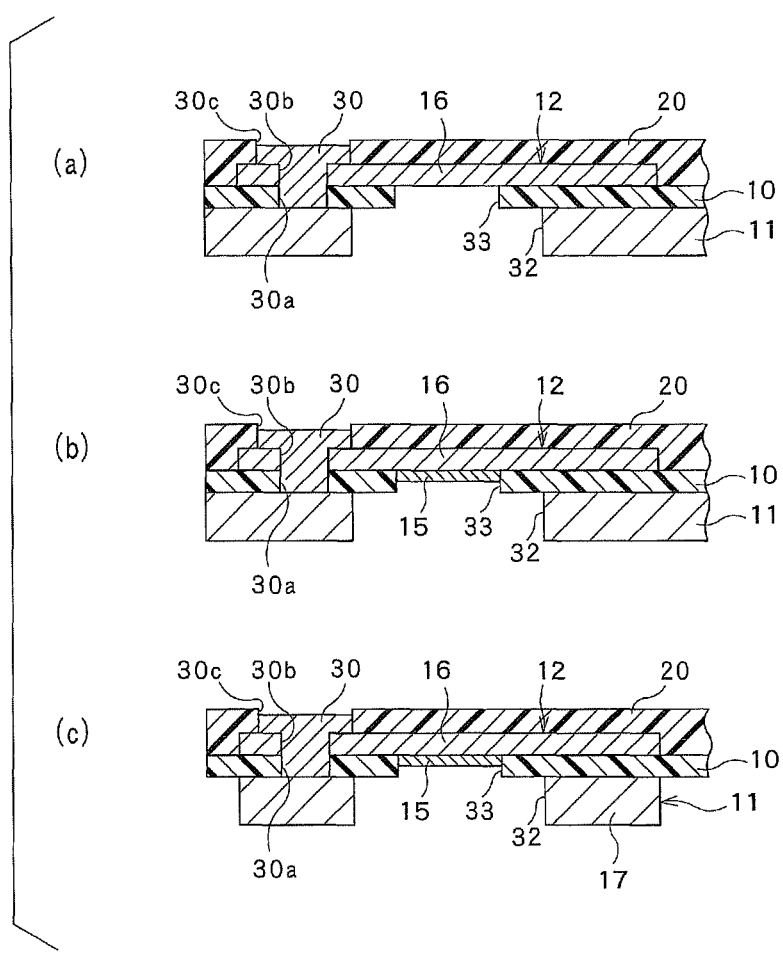
FIGS. 10(a) through 10(c) are respectively provided for illustrating one variation of the method for manufacturing the suspension substrate related to the first embodiment of the present invention.

In this embodiment, one example, in which the conductive connection section 30 is formed, after the injection hole plated layer 15 and via plating layer 18 are respectively provided to the wiring connection section 16, as shown in FIGS. 9(e), 9(f), upon the manufacture of the suspension substrate 1, has been described. However, the formation or provision of such parts or sections is not limited to this example. For instance, as shown in FIGS. 10(a) through 10(c), the injection hole plated layer 15 may be provided to the wiring connection section after the conductive connection section 30 is formed, and then the frame portion 17 may be formed. In addition, when the injection hole plated layer 15 is formed, the nickel plating and gold plating may be provided to the top face of the conductive connection section 30, in the same manner as in the case of forming the injection hole plated layer 15.

Figure 11:
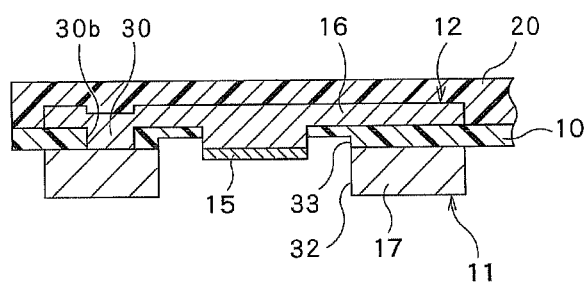
FIG. 11 is a cross section illustrating one variation of the connection structure region in the suspension substrate related to the first embodiment of the present invention.

Further, in this embodiment, one example, in which the suspension substrate 1 is manufactured by using the subtractive method, has been shown and described. However, the suspension substrate 1 may be manufactured by using a suitable additive method. FIG. 11 illustrates one cross section showing the structure of the connection structure region 3 of the suspension substrate 1 obtained by the additive method. In this case, the conductive connection section 30 is covered with the protective layer 20, and the wiring connection section 16 extends into the insulating-layer injection hole 33 and is exposed on the side of the metallic support layer 11.

Further, in this embodiment, the piezoelectric element 44 has been described, as one joined to the base plate 42, by way of example. However, the joining for the piezoelectric element is not limited to this example. For instance, the piezoelectric element 44 may be joined to only the load beam 43 in any give position, or otherwise may be joined to both of the base plate 42 and load beam 43. Further, a slider holding plate (not shown) for holding the slider 52 may be provided at a distal end of the load beam 43, such that the piezoelectric element 44 can be joined to a region between the load beam 43 and the slider holding plate.

Second Embodiment

Now, referring to FIG. 12, the suspension substrate, suspension, head suspension, hard disk drive, method for manufacturing the suspension substrate and method for testing the continuity of the suspension, respectively related to the second embodiment of the present invention, will be described.

Figure 12:
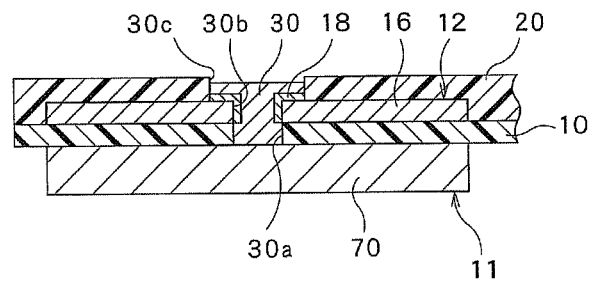
FIG. 12 is a cross section illustrating the connection structure region in the suspension substrate related to a second embodiment of the present invention.

As shown FIG. 12, the second embodiment features that the metallic-support-layer injection hole and insulating-layer injection hole are not respectively provided. However, except for this feature, the other construction of this second embodiment is substantially the same as the first embodiment shown in FIGS. 1 through 9. It is noted that like parts in the first embodiment shown in FIGS. 1 through 9 are respectively designated by like reference numerals in FIG. 12, and further explanation on such parts will be omitted below.

Namely, as shown in FIG. 12, the metallic support layer includes a disk portion 70 provided in the connection structure region 3 and formed into a disk-like shape. Further, in the connection structure region 3, the metallic-support-layer injection hole 33 (see FIG. 2) is not provided in the metallic support layer 11, and the insulating-layer injection hole 32 is not provided in the insulating layer 10. Accordingly, the wiring connection section 16 is not exposed on the side of the metallic support layer 11. In order to electrically connect the piezoelectric element 44 with the disk portion 70 of the metallic support layer 11, the conductive adhesive is provided between the piezoelectric element 44 and the disk portion 70.

Namely, according to this embodiment, the wiring connection section 16 of the wiring layer 12 is electrically connected with the disk portion 70 of the metallic support layer 11, via the conductive connection section 30. Further, the disk portion 70 is electrically connected with the piezoelectric element 44, via the second conductive connection section 48. Therefore, the piezoelectric element 44 can be electrically connected with the wiring connection section 16, via the conductive connection section 30 and disk portion 70. As such, the reliability of electrical connection between the suspension substrate 1 and the piezoelectric element 44 can be enhanced.

Further, according to this embodiment, since the metallic-support-layer injection hole 33 and insulating-layer injection hole 32 are not respectively provided, the amount of the conductive adhesive required for connecting the piezoelectric element 44 with the wiring connection section 16 of the wiring layer 12 can be substantially reduced.

Further, according to this embodiment, since the conductive connection section 30 is exposed to the exterior from the protective layer 20, the continuity test between the conductive connection section 30 and the piezoelectric element 44 can be performed, from the top face of the conductive connection section 30, by using the continuity inspection equipment 49, such as the probe or the like. Thus, the reliability of electrical connection between the suspension substrate 1 and the piezoelectric element 44 can be ensured. Additionally, in this case, since the conductive connection section 30 is formed by the nickel plating, the deformation of the top face of the conductive connection section 30 can be prevented, even in the case in which the distal end of the continuity inspection equipment 49 is pressed against the top face of the conductive connection section 30.

Third Embodiment

Next, referring to FIGS. 13 and 14, the suspension substrate, suspension, head suspension, hard disk drive, method for manufacturing the suspension substrate and method for testing the continuity of the suspension, respectively related to the third embodiment of the present invention, will be described.

Figure 13:
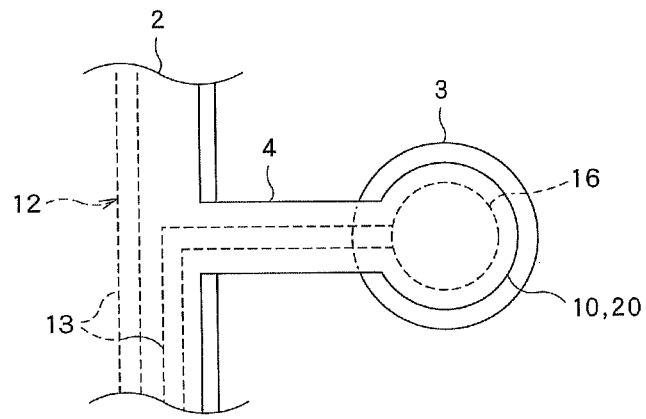
FIG. 13 is a plan view illustrating the connection structure region in the suspension substrate related to a third embodiment of the present invention.
Figure 14:
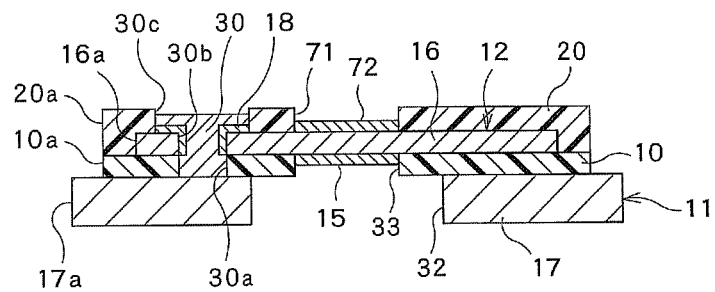
FIG. 14 is a cross section illustrating the connection structure region in the suspension substrate related to a third embodiment of the present invention.

As shown in FIGS. 13 and 14, the third embodiment features that the outer periphery of the frame portion of the metallic support layer is positioned outside relative to the outer periphery of the insulating layer and the outer periphery of the protective layer, and that a through hole for exposing the wiring connection section of the wiring layer is provided in the protective layer, with the gold plating being provided to the exposed portion of the wiring connection section in the through hole. However, except for this key point, the other construction of this third embodiment is substantially the same as the first embodiment shown in FIGS. 1 through 9. It is noted that like parts or components in the first embodiment shown in FIGS. 1 through 9 are respectively designated by like reference numerals in FIGS. 13 and 14, and further explanation on such parts or components will be omitted below.

In the suspension substrate 1 of this embodiment shown in FIG. 13, an extension structure region 4 is provided to extend between the substrate main body region 2 and the connection structure region 3.

Further, as shown in FIG. 14, the outer periphery 17a of the frame portion 17 of the metallic support layer 11 in the connection structure region 13 is positioned outside relative to the outer periphery 10a of the insulating layer 10, the outer periphery 16a of the wiring connection section 16 of the wiring layer 12 and the outer periphery 20a of the protective layer 20. Namely, in the connection structure region 3, the insulating layer 10, wiring connection section 16 and protective layer 20 are respectively formed into a substantially circular shape, and concentric relative to the ring-like frame portion 17 of the metallic support layer 11, with the outer diameter of this frame portion 17 being greater than each outer diameter of the insulating layer 10, wiring connection section 16 and protective layer 20.

An inspection through hole 71 for exposing the wiring connection section 16 of the wiring layer 12 is provided in the protective layer 20. In this inspection through hole 71, the nickel plating and gold plating are provided, successively, to the exposed portion of the wiring connection section 16, in order to form an inspection plated layer 72. More specifically, the inspection plated layer 72 is provided by first forming the inspection through hole 71 when the protective-layer conductive connection section 30c is formed in the protective layer 20, and then providing the nickel plating and gold plating to the exposed portion of the wiring connection section 16 in the so-formed inspection through hole 71, in the same manner as in the case of forming the injection hole plated layer 15.

As described above, according to this embodiment, the wiring connection section 16 of the wiring layer 12 is electrically connected with the frame portion 17 of the metallic support layer 11, via the conductive connection section 30. Further, the frame portion 17 is electrically connected with the piezoelectric element 44, via the second conductive connection section 48. Thus, the piezoelectric element 44 can be electrically connected with the wiring connection section 16, via the conductive connection section 30 and frame portion 17. In particular, even in the case in which the conductive adhesive injected in the metallic-support-layer injection hole 32 and insulating-layer injection hole 33 does not reach the wiring connection section 16 (see FIG. 6), the piezoelectric element 44 can be electrically connected, securely, with the wiring connection section 16. As such, the reliability of electrical connection between the suspension substrate 1 and the piezoelectric element 44 can be enhanced.

Further, according to this embodiment, the outer periphery 17a of the frame portion 17 of the metallic support layer 11 is positioned outside relative to the outer periphery 10a of the insulating layer 10 and the outer periphery 20a of the protective layer 20. Therefore, the outer periphery 17a of the frame portion 17 can be visually confirmed when the piezoelectric element 44 is connected with the connection structure region 3 of the suspension substrate 1, via the conductive adhesive. This visual confirmation can positively prevent the conductive adhesive from being unduly overflowed from the frame portion 17 and thus reaching any other metallic structure (e.g., the base plate 42 or the like) located around the connection structure region 3. Therefore, a short circuit that may be otherwise caused between the first electrode 44a and second electrode 44b and the common electrode 44c in the piezoelectric element 44, due to such overflowed conductive adhesive, can be effectively prevented.

Further, according to this invention, since the conductive connection section 30 is exposed to the exterior from the protective layer 20, the continuity test between the conductive connection section 30 and the piezoelectric element 44 can be performed, from the top face of the conductive connection section 30, by using the continuity inspection equipment 49, such as the probe or the like. Therefore, the reliability of electrical connection between the suspension substrate 1 and the piezoelectric element 44 can be ensured. Further, in this case, since the conductive connection section 30 is formed by the nickel plating, the deformation of the top face of the conductive connection section 30 can be prevented, even in the case in which the distal end of the continuity inspection equipment 49 is pressed against the top face of the conductive connection section 30.

Furthermore, according to this embodiment, since the wiring connection section 16 is exposed to the exterior from the protective layer 20, the continuity test between the wiring connection section 16 and the piezoelectric element 44 can be performed, from the top face of the wiring connection section 16, by using the continuity inspection equipment 49, such as the probe or the like. Thus, the reliability of electrical connection between the suspension substrate 1 and the piezoelectric element 44 can be ensured. Further, in this case, since the gold plating is provided to the wiring connection section 16, deformation of the top face of the wiring connection section 16 can be well prevented, even in the case in which the distal end of the continuity inspection equipment 49 is pressed against the top face of the wiring connection section 16. In addition, the corrosion in the exposed portion of the wiring connection section 16 of the wiring layer 12 can be securely prevented.

Fourth Embodiment

Now, referring to FIGS. 15 and 16, the suspension substrate, suspension, head suspension, hard disk drive, method for manufacturing the suspension substrate and method for testing the continuity of the suspension, respectively related to the fourth embodiment of the present invention, will be described.

Figure 15:
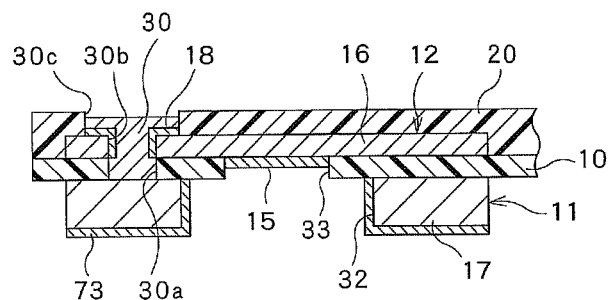
FIG. 15 is a cross section illustrating the connection structure region in the suspension substrate related to a fourth embodiment of the present invention.
Figure 16:
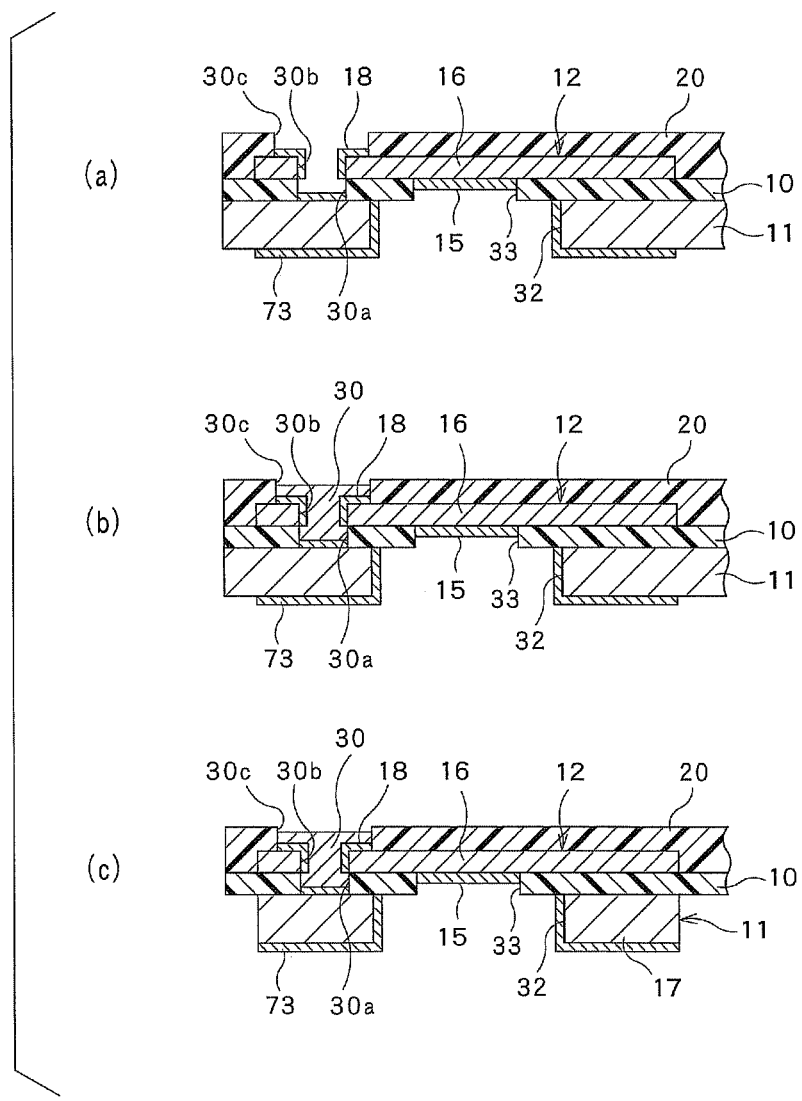
FIGS. 16(a) through 16(c) are respectively provided for illustrating one method for manufacturing the suspension substrate related to the fourth embodiment of the present invention.

Namely, as shown in FIGS. 15 and 16, the fourth embodiment features that the gold plating is provided to the metallic support layer 11 in the connection structure region. However, except for this key point, the other construction of this fourth embodiment is substantially the same as the first embodiment shown in FIGS. 1 through 9. It is noted that like parts or components in the first embodiment shown in FIGS. 1 through 9 are respectively designated by like reference numerals in FIGS. 15 and 16, and further explanation on such parts or components will be omitted below.

As shown in FIG. 15, a connection plated layer 73 is formed by providing the nickel plating and gold plating to the frame portion 17 of the support metallic layer 11.

In the case of manufacturing the suspension substrate 1 of this embodiment, when the exposed portion of the wiring connection section 16 is plated after the insulating-layer conductive connection hole 30a and insulating-layer injection hole 33 are respectively formed in the insulating layer 10 (see FIG. 9(d)), the nickel plating and gold plating are provided to the metallic support layer 11, in order to form the connection plated layer 73, in the same manner as in the case of forming the injection hole plated layer 15 and via plated layer 18 (see FIG. 16(a)). In this case, the connection plated layer 73 is formed, by using a suitable resist (not shown), in a position corresponding to the frame portion 17 of the metallic support layer 11 (it is noted that the outer shape of the metallic support layer 11 will be processed later). Further, the nickel plating and gold plating are provided to an exposed portion of the frame portion 17 in the insulating-layer conductive connection hole 30a.

Thereafter, the conductive connection section 30 is formed in the insulating-layer conductive connection hole 30a, wiring-layer conductive connection hole 30b and protective-layer conductive connection hole 30c (see FIG. 16(b)). Then, the outer shape of the metallic support layer 11 is processed, in order to form the frame portion 17 (see FIG. 16(c)).

As described above, according to this embodiment, the wiring connection section 16 of the wiring layer 12 is electrically connected with the frame portion 17 of the metallic support layer 11, via the conductive connection section 30. Further, the frame portion 17 is electrically connected with the piezoelectric element 44, via the second conductive section 48. Thus, the piezoelectric element 44 can be electrically connected with the wiring connection section 16, via the conductive connection section 30 and frame portion 17. In particular, even in the case in which the conductive adhesive injected in the metallic-support-layer injection hole 32 and insulating-layer injection hole 33 does not reach the wiring connection section 16 (see FIG. 6), the piezoelectric element 44 can be electrically connected, securely, with the wiring connection section 16. As such, the reliability of electrical connection between the suspension substrate 1 and the piezoelectric element 44 can be enhanced.

Further, according to this embodiment, since the gold plating is provided to the frame portion 17 of the metallic support layer 11, the piezoelectric element 44 can be electrically connected with the metallic support layer 11, by using solder, in place of using the conductive adhesive.

In addition, according to this embodiment, since the conductive connection section 30 is exposed to the exterior from the protective layer 20, the continuity test between the conductive connection section 30 and the piezoelectric element 44 can be performed, from the top face of the conductive connection section 30, by using the continuity inspection equipment 49, such as the probe or the like. Thus, the reliability of electrical connection between the suspension substrate 1 and the piezoelectric element 44 can be ensured. Additionally, in this case, since the conductive connection section 30 is formed by the nickel plating, the deformation of the top face of the conductive connection section 30 can be prevented, even in the case in which the distal end of the continuity inspection equipment 49 is pressed against the top face of the conductive connection section 30.

Figure 17:
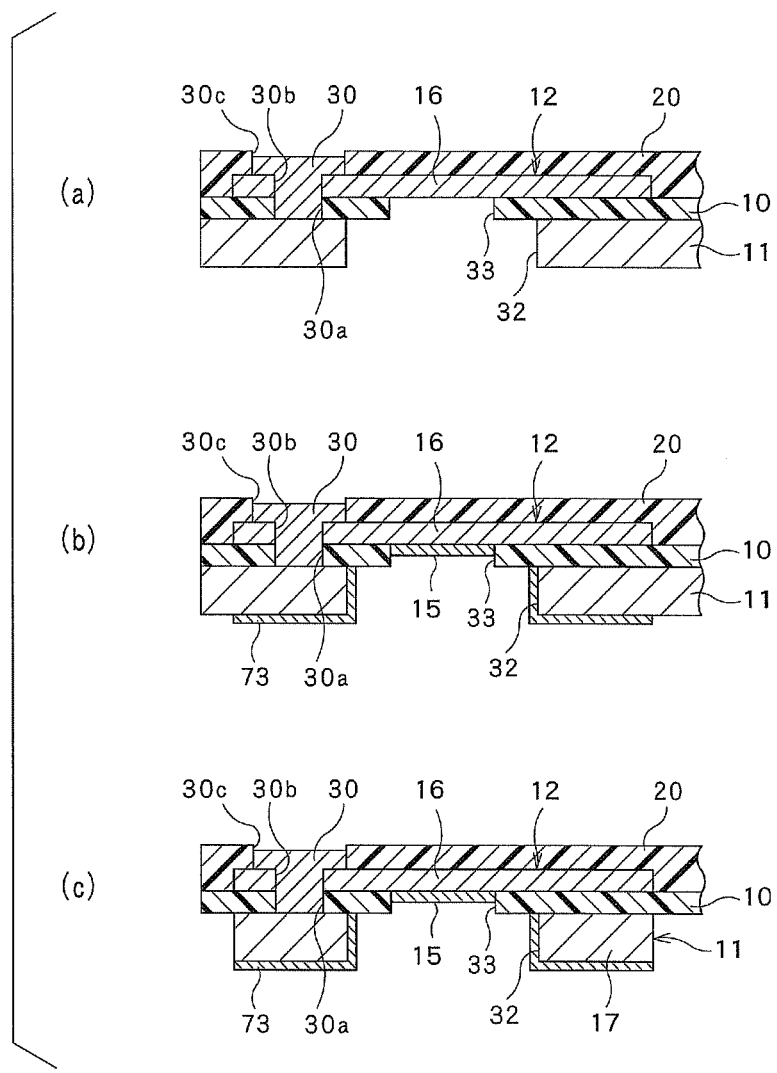
FIGS. 17(a) through 17(c) are respectively provided for illustrating one variation of the method for manufacturing the suspension substrate related to the fourth embodiment of the present invention.

In this embodiment, one example has been described, in which the conductive connection section 30 is formed, after the injection hole plated layer 15 and via plated layer 18 are respectively provided to the wiring connection section 16 as well as the connection plated layer 73 is provided to the frame portion 17 of the metallic support layer 11, as shown in FIGS. 16(a) and 16(b), when the suspension substrate 1 is manufactured. However, the method for manufacturing the suspension substrate 1 is not limited to this example. For instance, as shown in FIGS. 17(a) through 17(c), the injection hole plated layer 15 for the wiring connection section 16 may be provided together with the connection plated layer 73 after the conductive connection section 30 is formed, and then the frame portion 17 may be formed. It is noted that when the injection hole plated layer 15 is formed, the nickel plating and gold plating may be provided to the top face of the conductive connection section 30 in the same manner as in the case of forming the injection hole plated layer 15.

In this embodiment, in the case in which a ground terminal (not shown) is not provided to the suspension substrate 1, and, in which the conductive connection section (or via) 30 is provided to only the connection structure region 3, the suspension substrate 1 can be manufactured in the following manner. Namely, when the metallic-support-layer injection hole 33 is formed in the metallic support layer 11 (see FIG. 9(b)), the outer shape of the metallic support layer 11 in the connection structure region 3 is processed, in order to form the frame portion 17. Thus, the frame portion 17 is separated from the other part of the metallic support layer 11 provided in the substrate main body region 2. Thereafter, the nickel plating and gold plating are provided to the frame portion 17, by jig plating, without using the resist, in order to form the connection plated layer 73 (see FIG. 16(a) or 17(b)). Then, the outer shape of the other part of the metallic support layer 11, than the part of this layer 11 provided in the connection structure region 3, is processed (see FIG. 16(c) or 17(c)).

Fifth Embodiment

Next, referring to FIG. 18, the suspension substrate, suspension, head suspension, hard disk drive, method for manufacturing the suspension substrate and method for testing the continuity of the suspension, respectively related to the fifth embodiment of the present invention, will be described.

Figure 18:
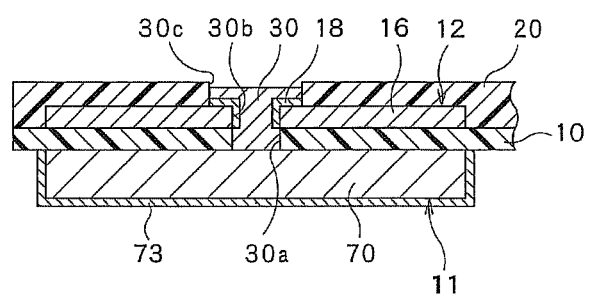
FIG. 18 is a cross section illustrating the connection structure region in the suspension substrate related to a fifth embodiment of the present invention.

Namely, as shown in FIG. 18, the fifth embodiment features that the metallic-support-layer injection hole and insulating-layer injection hole are not provided therein. However, except for this feature, the other construction of the fifth embodiment is substantially the same as the fourth embodiment shown in FIGS. 15 and 16. It is noted that like parts or components in the fourth embodiment shown in FIGS. 15 and 16 are respectively designated by like reference numerals in FIG. 18, and further explanation on such parts or components will be omitted below.

As shown in FIG. 18, the metallic support layer 11 includes the disk portion 70 provided in the connection structure region 3 and formed into the disk-like shape, as in the second embodiment shown in FIG. 12. However, in the connection structure region 3 of this embodiment, the metallic-support-layer injection hole 33 (see FIG. 2) is not provided in the metallic support layer 11, and the insulating-layer injection hole 32 is not provided in the insulating layer 10. Accordingly, the wiring connection section 16 is not exposed on the side of the metallic support layer 11. In order to electrically connect the piezoelectric element 44 with the disk portion 70 of the metallic support layer 11, the conductive adhesive is provided between the piezoelectric element 44 and the disk portion 70.

Namely, according to this embodiment, the wiring connection section 16 of the wiring layer 12 is electrically connected with the disk portion 70 of the metallic support layer 11, via the conductive connection section 30. Further, the disk portion 70 is electrically connected with the piezoelectric element 44, via the second conductive connection section 48. Therefore, the piezoelectric element 44 can be electrically connected with the wiring connection section 16, via the conductive connection section 30 and disk portion 70. Thus, the reliability of electrical connection between the suspension substrate 1 and the piezoelectric element 44 can be enhanced.

Further, according to this embodiment, since the metallic-support-layer injection hole 33 and insulating-layer injection hole 32 are not provided, the amount of the conductive adhesive required for connecting the piezoelectric element 44 with the wiring connection section 16 of the wiring layer 12 can be reduced.

Furthermore, according to this embodiment, since the gold plating is provided to the frame portion 17 of the metallic support layer 11, the piezoelectric element 44 can be electrically connected with the metallic support layer 11, by using the solder, in place of using the conductive adhesive.

In addition, according to this embodiment, since the conductive connection section 30 is exposed to the exterior from the protective layer 20, the continuity test between the piezoelectric element 44 and the conductive connection section 30 can be performed, from the top face of the conductive connection section 30, by using the continuity inspection equipment 49, such as the probe or the like. Thus, the reliability of electrical connection between the suspension substrate 1 and the piezoelectric element 44 can be ensured. Additionally, in this case, since the conductive connection section 30 is formed by the nickel plating, the deformation of the top face of the conductive connection section 30 can be prevented, even in the case in which the distal end of the continuity inspection equipment 49 is pressed against the top face of the conductive connection section 30.

Sixth Embodiment

Now, referring to FIG. 19, the suspension substrate, suspension, head suspension, hard disk drive, method for manufacturing the suspension substrate and method for testing the continuity of the suspension, respectively related to the sixth embodiment of the present invention, will be described.

Figure 19:
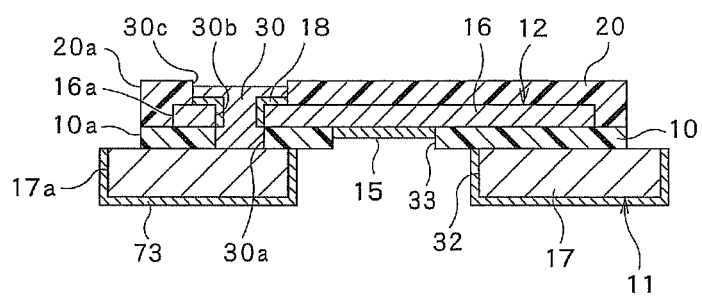
FIG. 19 is a cross section illustrating the connection structure region in the suspension substrate related to a sixth embodiment of the present invention.

Namely, as shown in FIG. 19, the sixth embodiment features that the outer periphery of the metallic support layer is positioned outside relative to the outer periphery of the insulating layer and the outer periphery of the protective layer. However, except for this feature, the other construction of the sixth embodiment is substantially the same as the fourth embodiment shown in FIGS. 15 and 16. It is noted that like parts or components in the fourth embodiment shown in FIGS. 15 and 16 are respectively designated by like reference numerals in FIG. 19, and further explanation on such parts or components will be omitted below.

In the suspension substrate 1 of this embodiment, the extension structure region 4 (see FIG. 13) is provided to extend between the substrate main body region 2 and the connection structure region 3.

Further, as shown in FIG. 19, the outer periphery 17a of the frame portion 17 of the metallic support layer 11 in the connection structure region 13 is positioned outside relative to the outer periphery 10a of the insulating layer 10, the outer periphery 16a of the wiring connection section 16 of the wiring layer 12 and the outer periphery 20a of the protective layer 20. Namely, in the connection structure region 3, the insulating layer 10, wiring connection section 16 and protective layer 20 are respectively formed into the substantially circular shape, and concentric relative to the ring-like frame portion 17 of the metallic support layer 11, with the outer diameter of this frame portion 17 being greater than each outer diameter of the insulating layer 10, wiring connection section 16 and protective layer 20.

As described above, according to this embodiment, the wiring connection section 16 of the wiring layer 12 is electrically connected with the frame portion 17 of the metallic support layer 11, via the conductive connection section 30. Further, the frame portion 17 is electrically connected with the piezoelectric element 44, via the second conductive connection section 48. Thus, the piezoelectric element 44 can be electrically connected with the wiring connection section 16, via the conductive connection section 30 and frame portion 17. In particular, even in the case in which the conductive adhesive injected in the metallic-support-layer injection hole 32 and insulating-layer injection hole 33 does not reach the wiring connection section 16 (see FIG. 6), the piezoelectric element 44 can be electrically connected, securely, with the wiring connection section 16. As such, the reliability of electrical connection between the suspension substrate 1 and the piezoelectric element 44 can be enhanced.

Further, according to this embodiment, since the gold plating is provided to the frame portion 17 of the metallic support layer 11, the piezoelectric element 44 can be electrically connected with the metallic support layer 11, by using the solder, in place of using the conductive adhesive.

Further, according to this embodiment, the outer periphery 17a of the frame portion 17 of the metallic support layer 11 is positioned outside relative to the outer periphery 10a of the insulating layer 10 and the outer periphery 20a of the protective layer 20. Therefore, the outer periphery 17a of the frame portion 17 can be visually confirmed when the piezoelectric element 44 is connected with the connection structure region 3 of the suspension substrate 1, via the conductive adhesive. This visual confirmation can positively prevent the conductive adhesive from being unduly overflowed from the frame portion 17 and thus reaching any other metallic structure (e.g., the base plate 42 or the like) located around the connection structure region 3. Therefore, the short circuit that may be otherwise caused between the first electrode 44a and second electrode 44b and the common electrode 44c in the piezoelectric element 44, due to such overflowed conductive adhesive, can be effectively prevented.

Further, according to this invention, since the conductive connection section 30 is exposed to the exterior from the protective layer 20, the continuity test between the conductive connection section 30 and the piezoelectric element 44 can be performed, from the top face of the conductive connection section 30, by using the continuity inspection equipment 49, such as the probe or the like. As such, the reliability of electrical connection between the suspension substrate 1 and the piezoelectric element 44 can be ensured. Further, in this case, since the conductive connection section 30 is formed by the nickel plating, the deformation of the top face of the conductive connection section 30 can be prevented, even in the case in which the distal end of the continuity inspection equipment 49 is pressed against the top face of the conductive connection section 30.

While several preferred embodiments of the present invention have been described and shown in detail, each of the suspension substrate, suspension, head suspension, hard disk drive, method for manufacturing the suspension substrate and method for testing the continuity of the suspension, respectively related to this invention, is not limited, in any way, to such embodiments. Namely, various modifications and variations can be made to such embodiments, without departing from the scope and gist of this invention.

The invention claimed is:

1. A suspension substrate including a connection structure region that can be connected with an actuator element via a conductive adhesive, the suspension substrate comprising:
an insulating layer;
a metallic support layer provided on an actuator element side of the insulating layer;
a wiring layer provided on another side of the insulating layer, the wiring layer including a plurality of wirings and a wiring connection section capable of being electrically connected with the actuator element; and a conductive connection section provided in the connection structure region and extending through the insulating layer and configured to connect the metallic support layer with the wiring connection section of the wiring layer,
wherein an actuator element side of the conductive connection section is covered by the metallic support layer.

2. The suspension substrate according to claim 1, wherein the conductive connection section is exposed on the outside of the suspension substrate on the side opposite to the actuator element.

3. The suspension substrate according to claim 2, further comprising a protective layer for covering the wiring layer,
wherein the conductive connection section is exposed to the exterior from the protective layer.

4. The suspension substrate according to claim 3,
wherein a through hole configured to expose the wiring connection section of the wiring layer is provided in the protective layer, and
wherein a gold plating is provided to an exposed portion of the wiring connection section in the through hole.

5. The suspension substrate according to claim 1,
wherein a metallic-support-layer injection hole extending through the metallic support layer and configured to inject the conductive adhesive is provided in the connection structure region,
wherein an insulating-layer injection hole extending through the insulating layer and configured to expose the wiring connection section is provided in a position corresponding to the metallic-support-layer injection hole, and
wherein a gold plating is provided to an exposed portion of the wiring connection section in the insulating-layer injection hole.

6. The suspension substrate according to claim 1, wherein a gold plating is provided to the metallic support layer in the connection structure region.

7. The suspension substrate according to claim 1, wherein the conductive connection section is formed of nickel.

8. A suspension comprising:
a base plate;
the suspension substrate according to claim 1 and attached to the base plate via a load beam; and
the actuator element joined to at least one of the base plate and load beam, the actuator element being connected with the connection structure region of the suspension substrate via the conductive adhesive.

9. A head suspension comprising:
the suspension according to claim 8; and
a slider mounted on the suspension.

10. A hard disk drive comprising:
a case;
a disk rotatably attached to the case and adapted for storing data therein;
a spindle motor adapted for rotating the disk;
the head suspension according to claim 9, wherein the slider of said head suspension is adapted for writing and reading the data relative to the disk; and
a voice coil motor adapted for moving the slider of the head suspension along the disk.

11. The suspension substrate according to claim 1, wherein an actuator element side of the wiring connection section is covered by the insulating layer.

12. The suspension substrate according to claim 1, wherein the actuator element side of the conductive connection section is covered by the metallic support layer via a gold plating.

13. The suspension substrate according to claim 1, wherein the outer periphery of the metallic support layer in the connection structure region is positioned outside relative to the outer periphery of the insulating layer and the outer periphery of the wiring connecting section of the wiring layer.

14. A method for manufacturing a suspension substrate including a connection structure region that can be connected with an actuator element via a conductive adhesive, the method comprising:
preparing a layered material including an insulating layer, a metallic support layer provided on an actuator element side of the insulating layer and having electrical conductivity, and a wiring layer provided on another side of the insulating layer;
forming a plurality of wirings and a wiring connection section that can be electrically connected with the actuator element in the wiring layer;
forming an insulating-layer conductive connection hole extending through the insulating layer in the connection structure region, in the insulating layer; and
forming a conductive connection section for connecting the metallic support layer with the wiring connection section of the wiring layer, in the insulating-layer conductive connection hole, wherein an actuator element side of the conductive connection section is covered by the metallic support layer.

15. The method for manufacturing the suspension substrate according to claim 14,
wherein a wiring-layer conductive connection hole extending through the wiring connection section is formed in a position corresponding to the insulating-layer conductive connection hole, when the plurality of wirings and wiring connection section are formed in the wiring layer, and
wherein the conductive connection section is formed in the insulating-layer conductive connection hole and wiring-layer conductive connection hole, and is exposed on the outside of the suspension substrate on the side opposite to the actuator element.

16. The method for manufacturing the suspension substrate according to claim 15, further comprising forming a protective layer for covering the wiring layer,
wherein when the protective layer is formed, a protective-layer conductive connection hole extending through the protective layer is formed in a position corresponding to the wiring-layer conductive connection hole, and
wherein the conductive connection section is formed in the insulating-layer conductive connection hole, wiring-layer conductive connection hole and protective-layer conductive connection hole, and is exposed to the exterior from the protective layer.

17. The method for manufacturing the suspension substrate according to claim 16, wherein when the protective layer is formed, a through hole configured to expose the wiring connection section of the wiring layer is formed in the protective layer, and a gold plating is provided to an exposed portion of the wiring connection section, in the through hole.

18. The method for manufacturing the suspension substrate according to claim 14, further comprising forming a metallic-support-layer injection hole extending through the metallic support layer and configured to inject the conductive adhesive, wherein when the insulating-layer conductive connection hole is formed in the insulating layer, an insulating-layer injection hole extending through the insulating layer and configured to expose the wiring connection section is formed in a position corresponding to the metallic-support-layer injection hole, and wherein a gold plating is provided to an exposed portion of the wiring connection section of the wiring layer, in the metallic-support-layer injection hole and insulating-layer injection hole.

19. The method for manufacturing the suspension substrate according to claim 14, wherein a gold plating is provided to the metallic support layer in the connection structure region.

20. The method for manufacturing the suspension substrate according to claim 14, wherein the conductive connection section is formed by a nickel plating.

21. The method for manufacturing the suspension substrate according to claim 14, wherein when the insulating-layer conductive connection hole is formed, the outer shape of the insulating layer is processed such that an actuator element side of the wiring connection section is covered by the insulating layer.

22. The method for manufacturing the suspension substrate according to claim 14, wherein a gold plating is provided to an exposed portion of the metallic support layer, in the insulating-layer conductive connection hole, and the actuator element side of the conductive connection section is covered by the metallic support layer via a gold plating.

23. The method for manufacturing the suspension substrate according to claim 14, further comprising processing the outer shape of the metallic support layer, wherein the outer shape of the metallic support layer is processed such that the outer periphery of the metallic support in the connection structure region is positioned outside relative to the outer periphery of the insulating layer and the outer periphery of the wiring connecting section of the wiring layer.

\* \* \* \* \*